United States Patent [19]
Caveney

[11] Patent Number: 5,894,760
[45] Date of Patent: Apr. 20, 1999

[54] SUBSTRATE TRANSPORT DRIVE SYSTEM

[75] Inventor: Robert T. Caveney, Windham, N.H.

[73] Assignee: Brooks Automation, Inc., Chelmsford, Mass.

[21] Appl. No.: 08/873,693

[22] Filed: Jun. 12, 1997

[51] Int. Cl.[6] .............................. B25J 11/00; B25J 18/00; F16H 25/20
[52] U.S. Cl. ..................... 74/490.03; 74/89.15; 310/114; 901/16; 901/23
[58] Field of Search ........................... 74/89.15, 490.03; 310/114; 901/16, 17, 23, 24

[56] References Cited

U.S. PATENT DOCUMENTS

| 4,645,409 | 2/1987 | Gorman | 901/21 X |
| 4,715,921 | 12/1987 | Maher et al. | 156/345 |
| 4,787,813 | 11/1988 | Stevens et al. | 901/28 X |
| 5,180,276 | 1/1993 | Hendrickson | 901/15 X |
| 5,506,460 | 4/1996 | Steinhart et al. | 310/114 X |

FOREIGN PATENT DOCUMENTS

WO 94/23911  10/1994  WIPO.

*Primary Examiner*—Allan D. Herrman
*Attorney, Agent, or Firm*—Perman & Green, LLP

[57] ABSTRACT

A substrate transport having a housing, a drive assembly connected to the housing, and a moveable arm assembly operably connected to the drive assembly. The drive assembly has a frame stationarily connected to the housing forming a cage with an open side. The drive assembly has a rotational drive and a vertical drive. The rotational drive is movably mounted to the frame inside the cage by a carriage. The vertical drive is mounted to the bottom of the frame and is attached to the rotational drive to move the rotational drive up and down on the frame. The rotational drive has two mirror image drive units.

36 Claims, 7 Drawing Sheets

SUBSTRATE TRANSPORT DRIVE SYSTEM

BACKGROUND OF THE INVENTION

1. Field of the Invention

The present invention relates to a substrate processing apparatus and, more particularly, to a substrate transport drive system.

2. Prior Art

U.S. Pat. No. 5,209,699 discloses a magnetic drive device for handling wafers in a vacuum. PCT International Publication No. WO 94/23911 discloses an articulated arm transfer device with coaxial drive shafts and two rotational drives connected to a mounting flange by screw drives.

SUMMARY OF THE INVENTION

In accordance with one embodiment of the present invention, a substrate transport is provided having a housing, a drive assembly connected to the housing, and a moveable arm assembly operably connected to the drive assembly. The drive assembly comprises a frame and a rotational drive assembly. The frame is stationarily connected to the housing. The frame forms a cage with an open side. The rotational drive assembly is mounted to the frame inside the cage. The rotational drive assembly is positioned in the cage through the open side as a modular unit. The open side allows access to components of the drive assembly at the open side.

In accordance with another embodiment of the present invention, a substrate transport drive system for a substrate processing apparatus is provided comprising a frame, a rotational drive, and a vertical drive. The rotational drive is moveably mounted to the frame. The vertical drive is connected between the frame and the rotational drive to move the rotational drive relative to the frame. A portion of the vertical drive is moveably located inside the rotational drive to reduce the length of the drive system.

In accordance with another embodiment of the invention, a substrate transport drive system for a substrate processing apparatus is provided. The drive system comprises a frame, a carriage moveably mounted to the frame, a rotational drive, and a linear drive. The frame is adapted to be stationarily mounted to a housing of the substrate processing apparatus. The rotational drive has a housing stationarily mounted to the carriage to thereby be moveably mounted to the frame. The linear drive is connected between the frame and the rotational drive to linearly move the rotational drive relative to the frame.

In accordance with another embodiment of the present invention, a substrate transport drive system is provided having a drive shaft assembly with two coaxial shafts and having two rotational drive units connected to each other and adapted to independently rotate the two coaxial shafts. The improvement comprises the two rotational drive units being substantially identical to each other and being attached to each other in reverse orientations.

In accordance with another embodiment of the present invention, a method of assembling a substrate transport drive system is provided comprising steps of providing a frame having a top adapted to be stationarily connected to a housing of a substrate processing apparatus; mounting a vertical drive unit to a bottom of the frame, the vertical drive unit having a main section stationarily connected to the frame with a rotatable screw shaft extending out of the main section and a rider on the screw shaft; mounting a rotational drive to the frame for up and down movement along the frame; and attaching the rider to the rotational drive. Rotation of the screw shaft moves the rider up and down along the screw shaft which, in turn, moves the rotational drive up and down along the frame. The vertical drive does not need to be sized to move the weight of the frame and the main section of the vertical drive relative to the housing of the substrate processing apparatus.

BRIEF DESCRIPTION OF THE DRAWINGS

The foregoing aspects and other features of the invention are explained in the following description taken in connection with the accompanying drawings, wherein.

DETAILED DESCRIPTION OF THE PREFERRED EMBODIMENT

Figure 1:
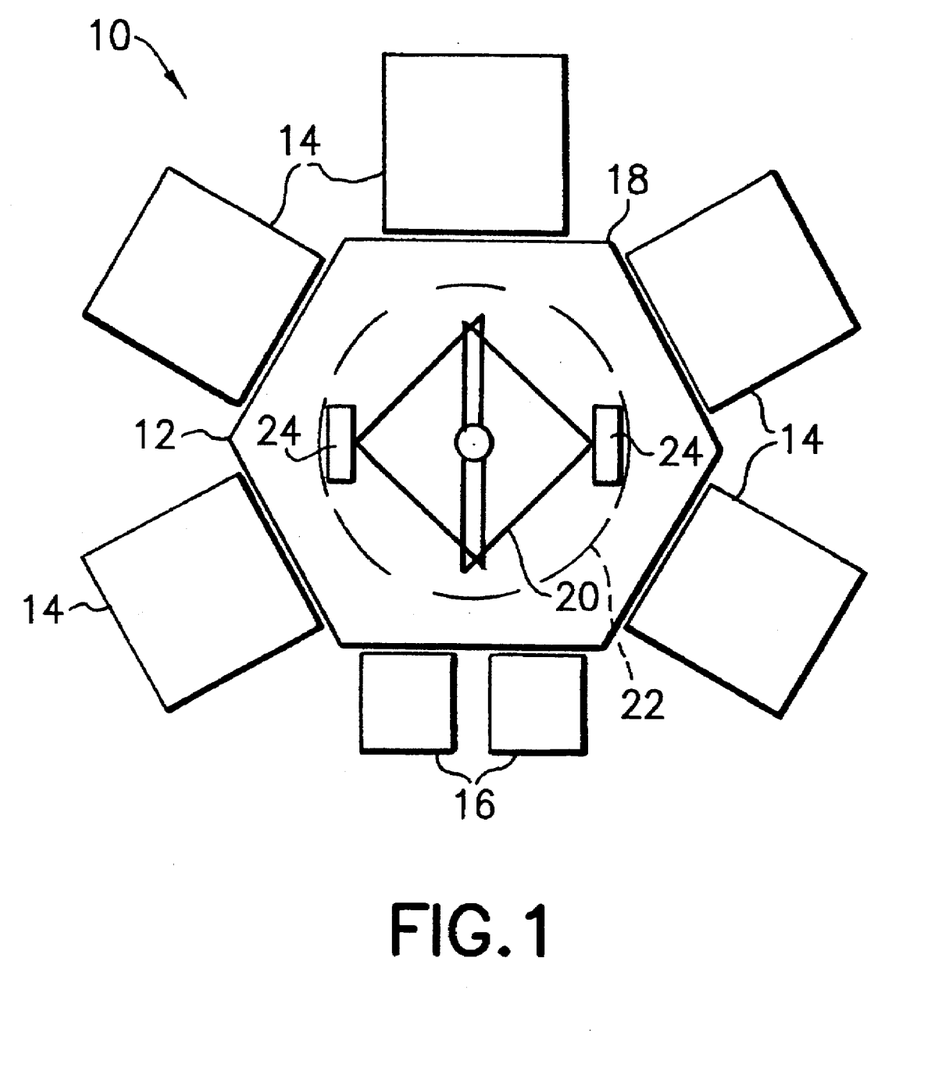
FIG. 1 is a schematic top plan view of a substrate processing apparatus having a substrate transport incorporating features of the present invention.

Referring to FIG. 1, there is shown a schematic top view of a substrate processing apparatus 10. The apparatus 10 includes a substrate transport 12, substrate processing modules 14, and load locks 16. A similar substrate processing apparatus is disclosed in U.S. Pat. No. 4,715,921 which is hereby incorporated by reference in its entirety. PCT patent publication No. WO 94/23911 discloses an articulated arm transfer device which is also hereby incorporated by reference in its entirety. The apparatus 10 is adapted to process substrates, such as semiconductor wafers or flat panel displays, as is known in the art.

The transport 12 includes a housing 18, a movable arm assembly 20, and a drive assembly 22. The processing modules 14 and load locks 16 are attached to sides of the housing 18. The housing 18 forms a vacuum chamber in which the arm assembly 20 can transport substrates between and/or among the load locks 16 and the processing modules 14. The arm assembly 20 is similar to that described in WO 94/23911 with substrate supporting end effectors 24. In alternate embodiments, other types of housings and/or movable arm assemblies could be used.

Figure 1A:
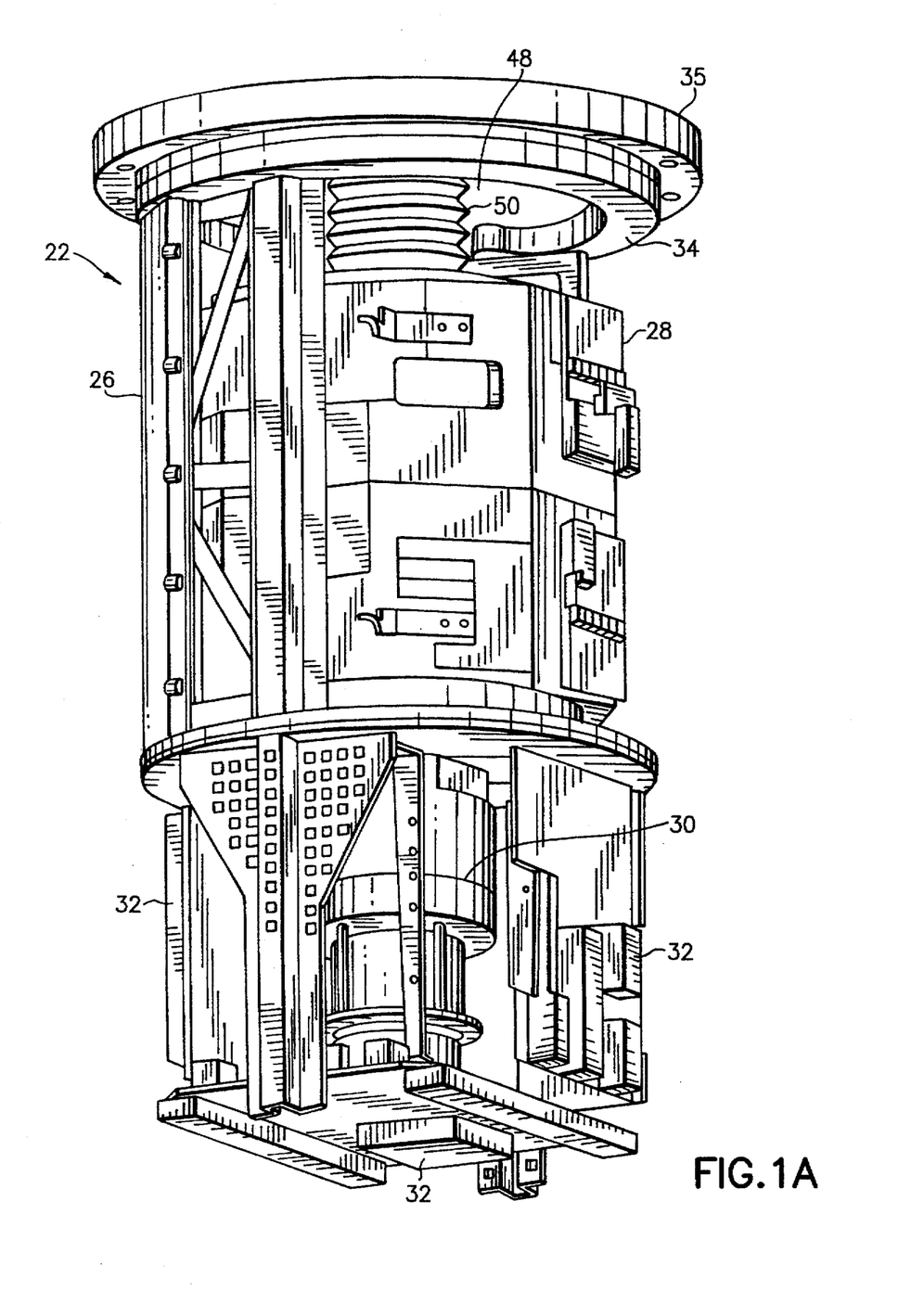
FIG. 1A is a perspective view of the substrate transport drive assembly used in the apparatus shown in FIG. 1.
Figure 2:
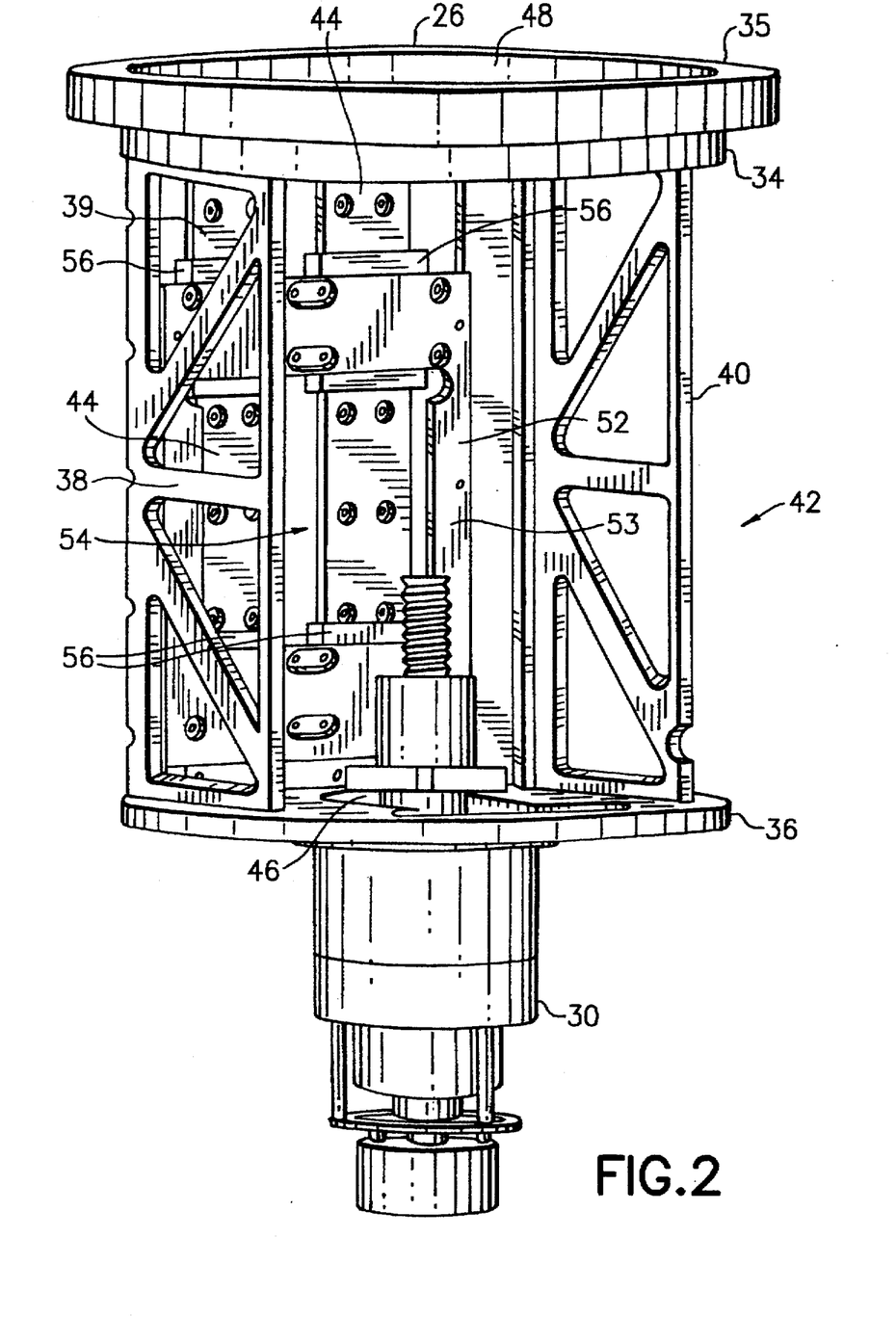
FIG. 2 is a perspective view of the frame and the vertical drive of the assembly shown in FIG. 1A.

Referring also to FIG. 1A, the drive assembly 22 is shown. The drive assembly 22 includes a frame 26, a rotational drive assembly 28, a vertical drive 30, and control circuitry 32. The drive assembly 22 is mounted to the underside of the housing 18. Referring also to FIG. 2, the frame 26 and vertical drive 30 are shown. The frame 26 includes a top flange 34, a bottom flange 36, and three side wall sections 38, 39, 40. The frame 26 forms a cage with an open front side 42. The top flange 34 is stationarily attached to a mounting flange 35 which is attached to the bottom of the housing 18.

The mounting flange 35 is removably mounted to the top flange 34 of the frame 26. This allows the manufacturer to select different types of mounting flanges for using the drive assembly 22 with different types of substrate transport housings without having to tear down the drive. The rear side wall 39 has two vertically orientated tracks or rails 44. Movably mounted on the rails 44 is a carriage 52. The carriage 52 has a frame 53 with a general square ring shape and a center aperture 54. The top and bottom of the carriage frame 53 have rail bearings 56 mounted thereto that keep the carriage 52 attached to the rails 44 and movably support the carriage for vertical movement up and down along the rails 44. The bottom flange 36 has a hole 46 in its center. The vertical drive 30 is mounted to the bottom flange 36 such that a portion of the vertical drive 30 projects through the hole 46 into the interior area of the cage. The top flange 34, as seen best in FIG. 1A, also has a hole 48. A portion of a drive shaft assembly of the rotational drive assembly 28 projects through the hole 48 and through a hole in the bottom of the housing 18 into the vacuum chamber formed by the housing. A bellows 50 is provided to maintain the vacuum in the vacuum chamber, but allow the rotational drive assembly 28 to be movable relative to the housing 18.

Figure 3:
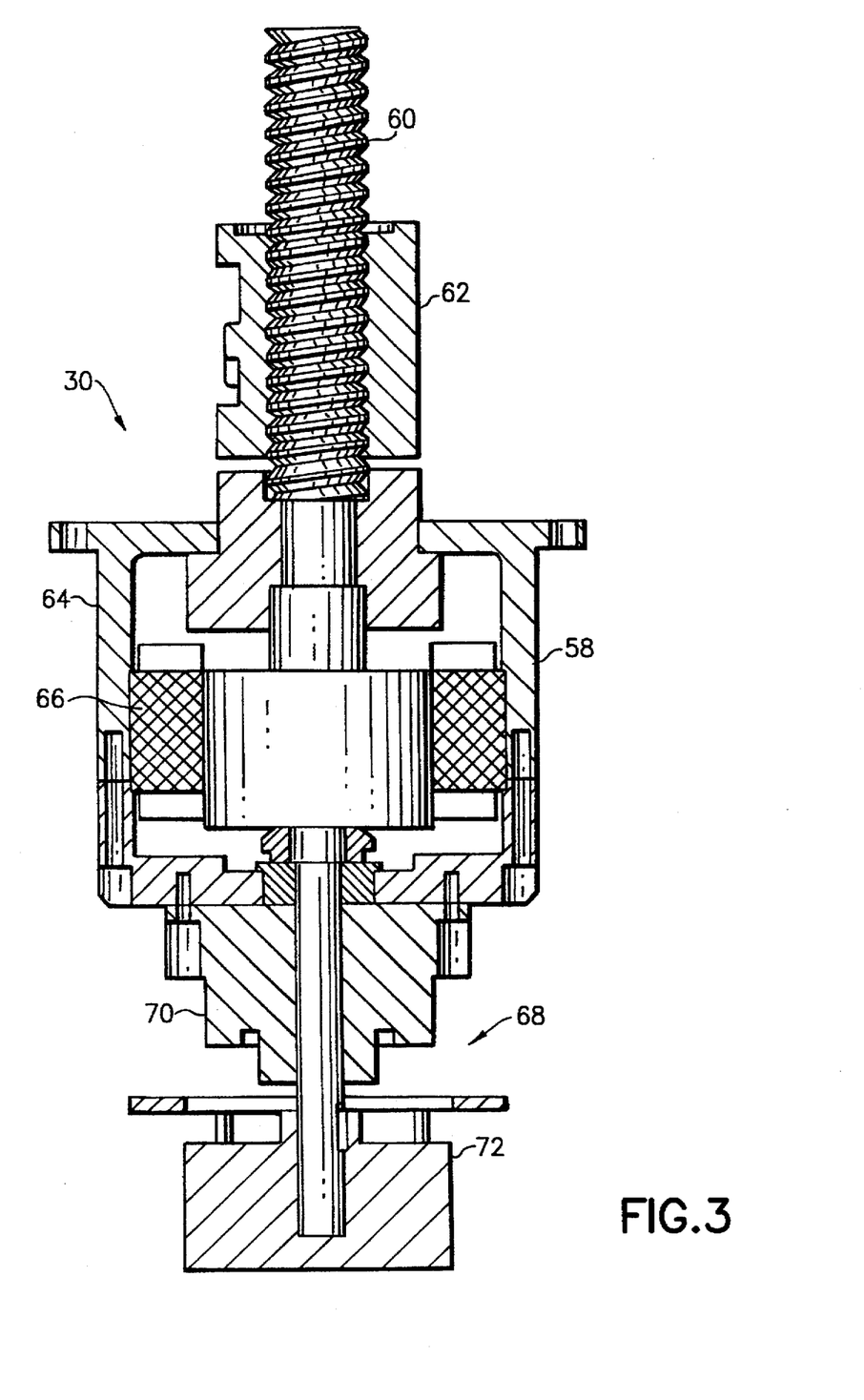
FIG. 3 is a cross-sectional view of the vertical drive shown in FIG. 2.

Referring also to FIG. 3, the vertical drive 30 is shown. The vertical drive 30 has a main section 58, a rotatable shaft 60, and a rider 62. The main section 58 has a housing 64, an electric motor 66, and an encoder 68. The housing 64 is stationarily attached to the bottom flange 36 of the frame 26. The motor 66 is located in the housing 64 and is adapted to axially rotate the shaft 60 relative to the housing 64. The encoder 68 comprises a first stationary piece 70 connected to the housing 64 and a second movable piece 72 connected to the bottom end of the shaft 60. The encoder 68 is preferably an optical encoder adapted to generate signals indicative of rotations of the shaft 60 relative to the housing 64 and rotational position of the shaft 60 relative to the housing 64. However, any suitable type of encoder or position sensor could be used. The top of the shaft 60 has a screw threads thereon. The rider 62 is mounted on the screw threads. The rider 62 is attached to the rotational drive assembly 28 as further described below. When the drive shaft 60 is axially rotated, the rider 62 is longitudinally moved along the shaft 60. Because the housing 64 is mounted to the frame 26 and the rider 62 is mounted to the rotational drive assembly 28, the rotational drive assembly 28 can be longitudinally moved relative to the frame 26. In an alternate embodiment, a vertical drive need not be provided, such as if the rotational drive units are stationarily connected to the cage.

Figure 4:
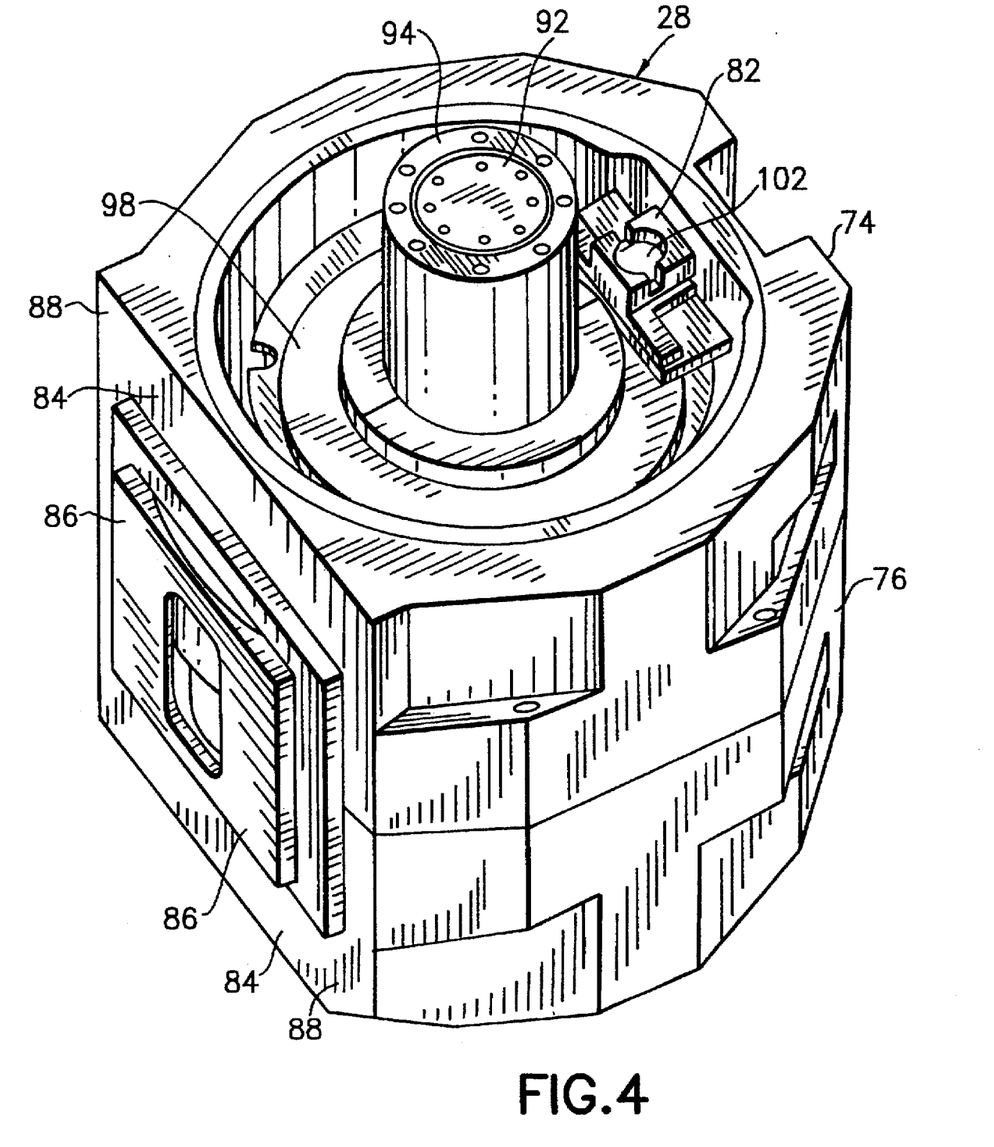
FIG. 4 is a top, rear and side perspective view of the rotational drive assembly shown in FIG. 1A.
Figure 5:
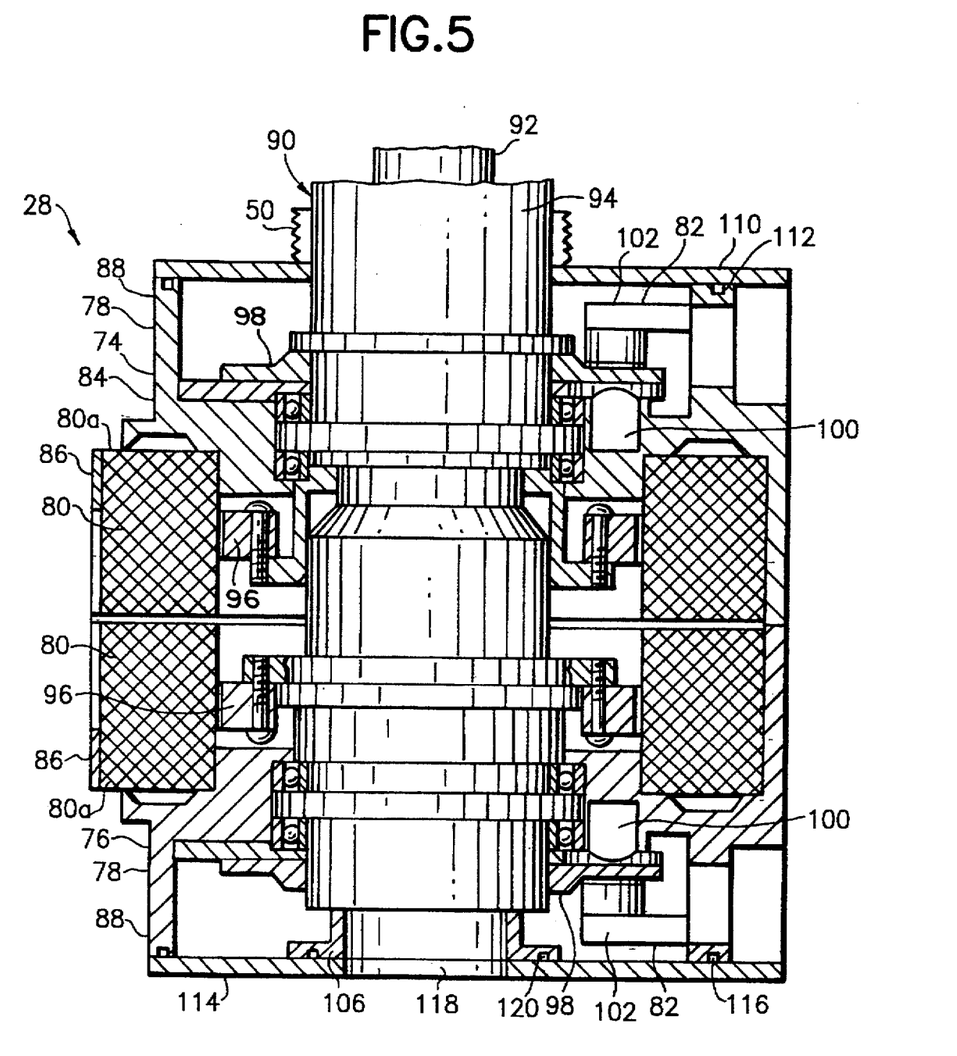
FIG. 5 is a schematic cross-sectional view of the rotational drive assembly shown in FIG. 4.

FIGS. 4 and 5 show the rotational drive assembly 28. The rotational drive assembly 28 includes two rotational drive units 74, 76. The two units 74, 76 are substantially identical to each other and are attached to each other in reverse orientations. Each unit 74, 76 has a frame or housing 78, an electromagnetic coil 80, and a position signaling device 82. The frames 78 are suitably sized and shaped to be located in the cage 26 through the open front side 42. The rear side 84 of the frames 78 have a center protruding section 86 with a stepped shape to a recessed surrounding perimeter section 88. The two protruding sections 86 are sized and shaped to be received in the center aperture 54 of the carriage 52 (see FIG. 2). The frames 78 are fixedly connected to each other to form a modular unit that is fixedly connected to the carriage 52 in a cantilever fashion. Thus, the rotational drive assembly 28 can vertically move relative to the cage 26 by means of the carriage 52 and the rails 44. In an alternate embodiment, the rails 44 could be located on opposite sides of the cage and, any suitable movable mounting could be provided including more than one carriage. As seen best in FIG. 5, the rear ends 80a of the coils 80 extend past the surrounding perimeter sections 88 of the frames 78. When the frames 78 are attached to the carriage 52, the rear ends 80a of the coils 80 extend into the center aperture 54 of the carriage 52. Thus, the center aperture 54 forms a seat for a portion of the two rotational drive electric motors. This reduces the size of the cage and rotational drive assembly as well as reducing the weight of the rotational drive assembly. Because the two coils 80 are located next to each other, this allows the placement of the two rear ends 80a in a seat of the carriage that is not excessively large. Thus, the carriage 52 does not need to be excessively large. This reduces the weight of the carriage 52.

The rotational drive assembly 28 is adapted to independently axially rotate two drive shafts 92, 94 of a drive shaft assembly 90. The two shafts 92, 94 are coaxially mounted to each other. The top ends of the shaft 92, 94 are connected to the movable arm assembly 20 (see FIG. 1) as is known in the art. The lower end of the inner shaft 92 is rotatably mounted to the bottom rotational drive unit 76. The lower end of the outer shaft 94 is rotatably mounted to the top rotational drive unit 74. The drive motors include sets of permanent magnets 96 attached to the bottom ends of the shafts 92, 94. The coils 80 are energized to move the magnets 96 and, thus, rotate the shafts 92, 94. Also fixedly mounted to the bottom ends of the shafts 92, 94 are disks 98. The disks 98 include a coded aperture pattern. The position signaling devices 82 includes a light 100 and an optical sensor 102. Light from the lights 100 passes through the apertures in the disks 98 and is received by the sensors 102. The sensors 102 output a signal to the controller which indicates the rotational position of the shafts relative to the frames 78. In alternate embodiments, other types of position signaling devices could be used. In the embodiment shown, the position signaling devices 82 are located at the front side of the frames 78 at the open front side 42 of the cage 26 for relatively easy adjustment and repair. A top plate 110 is mounted to the top unit 74 with the shafts 92, 94 projecting therethrough. An O-ring seal 112 is provided to seal the top plate 110 to the top unit's frame 78. The bellows 50 is attached to the top plate 110. A bottom plate 114 is mounted to the bottom unit 76. An O-ring seal 116 is provided to seal the bottom plate 114 to the bottom unit's frame 78. The bottom plate 114 has a hole 118 therethrough. An isolation cup 106 is mounted to the bottom plate 114 at the hole 118 with an O-ring seal 120 therebetween.

Figure 6:
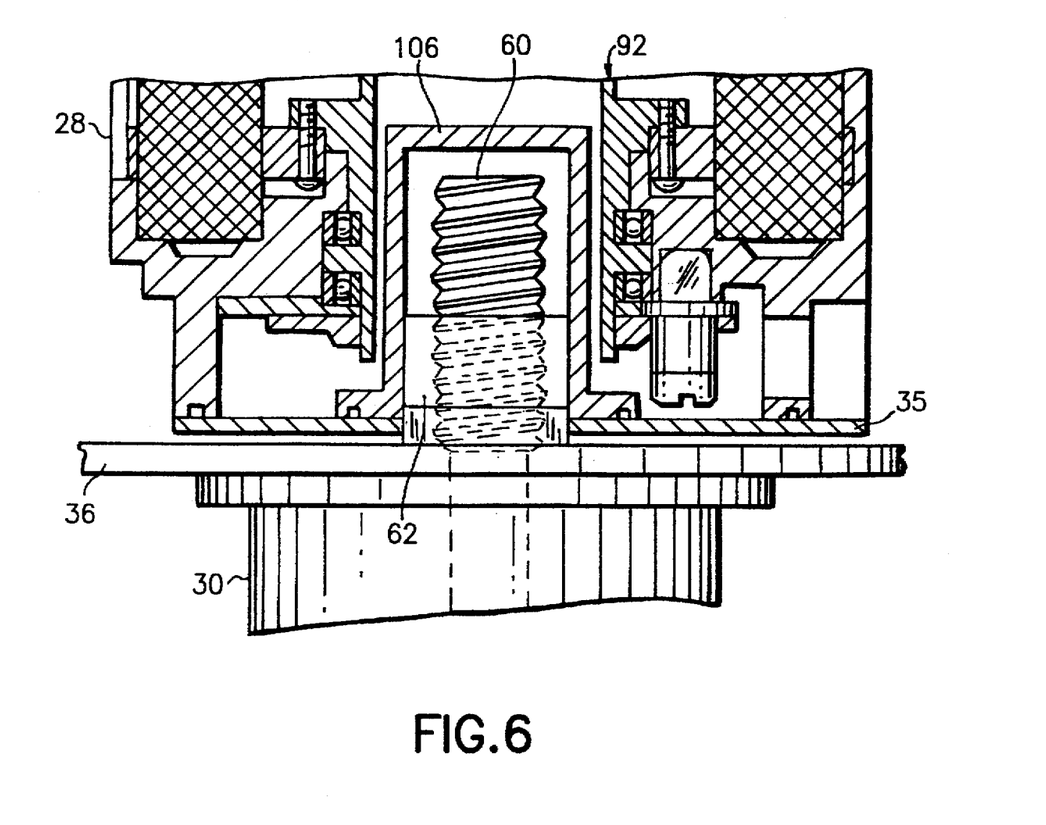
FIG. 6 is a schematic partial cross-sectional view of the connection of the vertical drive to the rotational drive.

Referring now to FIG. 6, the attachment of the vertical drive 30 to the rotational drive assembly 28 will be described. As seen best in FIG. 4, the bottom of the inner shaft 92 has a receiving area 104. Located in this receiving area 104 is an isolation cup 106 that is attached to the bottom of the inner shaft 92. The isolation cup is provided to help maintain the vacuum environment in the transport housing 18. The rider 62 of the vertical drive 30 is attached to the isolation cup 106 inside the cup and inside the receiving area 104 of the inner shaft 92. The threaded section of the vertical drive shaft 60 is also located in the cup 106 and in the receiving area 104. The drive shaft 60 is coaxial with the drive shaft assembly 90. When the vertical drive shaft 60 is rotated, the rider 62 can move up or down which, in turn, moves the rotational drive assembly 28 and the drive shaft assembly 90 up or down. By locating a portion of the vertical drive in the rotational drive assembly the overall length of the drive assembly 22 is reduced. This reduces the weight of the drive assembly 22.

It should be understood that the foregoing description is only illustrative of the invention. Various alternative and modifications can be devices by those skilled in the art without departing from the invention. Accordingly, the present invention is intended to embrace all such alternative, modifications and variances which fall within the scope of the appended claims.

What is claimed is:

1. A substrate transport having a housing, a drive assembly connected to the housing, and a movable arm assembly operably connected to the drive assembly, the drive assembly comprising:

a rigid frame stationarily connected to the housing, the frame forming a cage with an open side; and a rotational drive assembly mounted to the frame inside the cage, the rotational drive assembly being positioned in the cage through the open side as a modular unit and the open side allowing access to components of the rotational drive assembly at the open side.

2. A transport as in claim 1 wherein the rotational drive assembly is movably mounted to the frame for movement up and down inside the cage.

3. A transport as in claim 2 wherein the drive assembly further comprises a carriage movably mounted to the frame and connecting the rotational drive assembly to the frame.

4. A transport as in claim 3 wherein the carriage has a center recess with a portion of one side of the rotational drive assembly being located in the recess.

5. A transport as in claim 4 wherein the rotational drive assembly has two electromagnetic coils which have portions located in the center recess of the carriage.

6. A transport as in claim 2 wherein the drive assembly further comprises a vertical drive, the vertical drive having a main section stationarily connected to a bottom of the frame, a rotatable screw shaft, and a rider stationarily connected to a frame of the rotational drive assembly and mounted to the screw shaft for movement up and down the screw shaft as the screw shaft is rotated.

7. A transport as in claim 6 wherein the screw shaft extends into the rotational drive assembly.

8. A transport as in claim 7 wherein the screw shaft extends into a receiving area of a bottom end of a rotatable drive shaft of the rotational drive assembly.

9. A transport as in claim 1 wherein the rotational drive assembly includes coaxial drive shafts extending from two units adapted to rotate the drive shafts, the two units being substantially identical to each other and being attached to each other in reverse orientations.

10. A transport as in claim 1 wherein the frame has a top flange for mounting to a bottom of the housing.

11. A transport as in claim 1 wherein the open side is the only open side which the rotational drive assembly can pass through.

12. A transport as in claim 1 wherein the frame has a top flange, a bottom flange, and three side wall sections between the top and bottom flanges.

13. A transport as in claim 10 wherein the frame has side wall sections extending down from the top flange on two opposite sides forming an area which receives the rotational drive assembly therebetween.

14. In a substrate transport drive system having a drive shaft assembly with two coaxial shafts and having two rotational drive units connected to each other and adapted to independently rotate the coaxial shafts, wherein the improvement comprises:

the two rotational drive units being substantially identical to each other and being attached to each other in reverse orientations, and wherein each drive unit has a position sensor located at opposite ends of their respective drive units.

15. A substrate transport drive system for a substrate processing apparatus, the drive system comprising:

a frame;

a rotational drive movably mounted to the frame; and a vertical drive connected between the frame and the rotational drive to move the rotational drive relative to the frame, wherein a portion of the vertical drive is movably located inside the rotational drive to reduce the length of the drive system, wherein the rotational drive has a rotatable drive shaft with a recess in its bottom end, and wherein the portion of the vertical drive extends into the recess.

16. A system as in claim 15 wherein the portion of the vertical drive comprises a rotatable screw shaft.

17. A system as in claim 15 wherein the recess has an isolator, cup mounted therein.

18. A system as in claim 15 wherein the rotational drive is mounted to a carriage that is movably mounted to tracks of the frame.

19. A system as in claim 18 wherein the rotational drive has a motor that is located in a seat of the carriage.

20. A system as in claim 15 wherein the rotational drive includes two substantially identical units attached to each other in mirror image orientations.

21. A system as in claim 15 wherein the vertical drive is coaxially aligned with a rotational shaft of the rotational drive.

22. A substrate transport drive system for a substrate processing apparatus, the drive system comprising:

a frame having a top end adapted to be stationarily mounted to a bottom of a housing of the substrate processing apparatus;

a carriage movably mounted to the frame;

a rotational drive having a housing directly stationarily mounted to the carriage to thereby be moveably mounted to the frame; and a linear drive connected between the frame and the rotational drive to linearly move the rotational drive relative to the frame.

23. A system as in claim 22 wherein the carriage is movably mounted to tracks of the frame.

24. A system as in claim 23 wherein the rotational drive has a motor that is located, at least partially, in a recess of the carriage.

25. A system as in claim 23 wherein the tracks are located only on one side of the frame.

26. A system as in claim 23 wherein the linear drive is mounted to a bottom of the frame.

27. A system as in claim 26 wherein a portion of the linear drive is movably located inside a portion of the rotational drive.

28. A system as in claim 26 wherein the linear drive is coaxially aligned with drive shafts of the rotational drive.

29. A system as in claim 22 wherein the frame includes a cage and a mounting flange removably mounted to a top of the cage, wherein the mounting flange is sized and shaped to mount the cage to a housing of a substrate transport.

30. In a substrate transport drive system having a drive shaft assembly with two coaxial shafts and having two rotational drive units connected to each other and adapted to independently rotate the coaxial shafts, wherein the improvement comprises:

the two rotational drive units being substantially identical to each other and being attached to each other in reverse orientations and further comprising a vertical drive coaxially aligned with the drive shaft assembly.

31. A system as in claim 30 wherein each drive unit has a frame and an electromagnetic coil.

32. A system as in claim 31 wherein the coil of a first one of the units is located at a bottom of its respective frame adjacent the coil of a second one of the units located at a top of its respective frame.

33. A system as in claim 30 wherein each drive unit has an optical position sensor located at opposite ends of their respective drive units.

34. A system as in claim 30 wherein a portion of the vertical drive is movably located inside one of the rotational drive units.

35. A system as in claim 34 wherein the portion of the vertical drive is movably located inside the drive shaft assembly.

36. A method of assembling a substrate transport drive system comprising steps of:

providing a frame having a top adapted to be stationarily connected to a housing of a substrate processing apparatus;

mounting a vertical drive unit to a bottom of the frame, the vertical drive unit having a main section stationarily connected to the frame with a rotatable screw shaft extending out of the main section and a rider on the screw shaft;

mounting a rotational drive to the frame for up and down movement along the frame; and attaching the rider to the rotational drive;

wherein rotation of the screw shaft moves the rider up and down along the screw shaft which, in turn, moves the rotational drive up and down along the frame, and the vertical drive unit does not need to be sized to move the weight of the frame and the main section of the vertical drive unit relative to the housing of the substrate processing apparatus.

* * * * *